(12) United States Patent
Xie et al.

(10) Patent No.: US 11,710,699 B2
(45) Date of Patent: Jul. 25, 2023

(54) COMPLEMENTARY FET (CFET) BURIED SIDEWALL CONTACT WITH SPACER FOOT

(71) Applicant: International Business Machines Corporation, Armonk, NY (US)

(72) Inventors: Ruilong Xie, Niskayuna, NY (US); Jingyun Zhang, Albany, NY (US); Reinaldo Vega, Mahopac, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 17/463,704

(22) Filed: Sep. 1, 2021

(65) Prior Publication Data
US 2023/0062819 A1    Mar. 2, 2023

(51) Int. Cl.
*H01L 23/52* (2006.01)
*H01L 23/528* (2006.01)
(Continued)

(52) U.S. Cl.
CPC .... *H01L 23/5286* (2013.01); *H01L 21/26513* (2013.01); *H01L 21/823814* (2013.01);
(Continued)

(58) Field of Classification Search
CPC .......... H01L 23/5286; H01L 21/26513; H01L 21/823814; H01L 21/823871;
(Continued)

(56) References Cited

U.S. PATENT DOCUMENTS 9,659,963 B2    5/2017   Cheng
9,837,414 B1   12/2017   Balakrishnan
(Continued)

FOREIGN PATENT DOCUMENTS

CN        1665000 A    9/2005
CN      105977284 A    9/2016
(Continued)

OTHER PUBLICATIONS

A. Gupta-etal, "Buried Power Rail Integration With FinFETs for Ultimate CMOS Scaling," in IEEE Transactions on Electron Devices, vol. 67, No. 12, pp. 5349-5354, Dec. 2020, doi: 10.1109/TED.2020.3033510.
(Continued)

*Primary Examiner* — Mohammad M Hoque
(74) *Attorney, Agent, or Firm* — Matthew Zehrer

(57) ABSTRACT

A CFET includes a fin that has a bottom channel portion, a top channel portion, and a channel isolator between the bottom channel portion and the top channel portion. The CFET further includes a source and drain stack that has a bottom source or drain (S/D) region connected to the bottom channel portion, a top S/D region connected to the top channel portion, a source-drain isolator between the bottom S/D region and the top S/D region. The CFET further includes a spacer foot physically connected to a base sidewall portion of the bottom S/D region and a buried S/D contact that is physically connected to an upper sidewall portion of the bottom S/D region. The CFET may further include a common gate around the bottom channel portion, around the top channel portion, and around the channel isolator.

14 Claims, 16 Drawing Sheets

(51) Int. Cl.
*H01L 27/092* (2006.01)
*H01L 29/08* (2006.01)
*H01L 29/417* (2006.01)
*H01L 29/78* (2006.01)
*H01L 29/66* (2006.01)
*H01L 21/8238* (2006.01)
*H01L 21/265* (2006.01)

(52) U.S. Cl.
CPC ............ *H01L 21/823871* (2013.01); *H01L 21/823885* (2013.01); *H01L 27/0922* (2013.01); *H01L 29/0847* (2013.01); *H01L 29/41741* (2013.01); *H01L 29/66545* (2013.01); *H01L 29/66666* (2013.01); *H01L 29/7827* (2013.01)

(58) Field of Classification Search
CPC ......... H01L 21/823885; H01L 27/0922; H01L 29/0847; H01L 29/41741; H01L 29/66545; H01L 29/66666; H01L 29/7827
USPC ...................................................... 257/329
See application file for complete search history.

(56) References Cited

U.S. PATENT DOCUMENTS

| | | | |
|---|---|---|---|
| 10,192,867 | B1 | 1/2019 | Frougier |
| 10,304,832 | B1 | 5/2019 | Chanemougame |
| 10,985,064 | B2 | 4/2021 | Zhang |
| 11,195,794 | B2 * | 12/2021 | Do ................. H01L 21/823871 |
| 11,393,819 | B2 * | 7/2022 | Li ........................ H01L 23/5286 |
| 2016/0172460 | A1 | 6/2016 | Basker |
| 2017/0221884 | A1 * | 8/2017 | Machkaoutsan .... H01L 29/0669 |
| 2020/0075574 | A1 | 3/2020 | Smith |
| 2020/0411436 | A1 | 12/2020 | Xie |
| 2021/0098306 | A1 * | 4/2021 | Smith ............. H01L 21/823821 |

FOREIGN PATENT DOCUMENTS

| | | |
|---|---|---|
| CN | 110800113 A | 2/2020 |
| CN | 112687626 A | 4/2021 |
| WO | 20210613761 W | 4/2021 |

OTHER PUBLICATIONS

International Search Report and Written Opinion for Application PCT/CN2022/104390, dated Sep. 30, 2022, 9 pages.

* cited by examiner

US 11,710,699 B2

COMPLEMENTARY FET (CFET) BURIED SIDEWALL CONTACT WITH SPACER FOOT

BACKGROUND

Various embodiments of the present application generally relate semiconductor device fabrication methods and resulting structures. More specifically the various embodiments relate to complementary field-effect transistors (CFETs) that include a buried sidewall contact with a spacer foot upon a bottom or foot portion of a source or drain (S/D) region of a bottom transistor of the CFET.

SUMMARY

In an embodiment of the present invention, a semiconductor device is presented. The device includes a fin with a bottom channel portion, a top channel portion, and a channel isolator between the bottom channel portion and the top channel portion. The device further includes a source and drain stack with a bottom source or drain (S/D) region connected to the bottom channel portion, a top S/D region connected to the top channel portion, and a source-drain isolator between the bottom S/D region and the top S/D region. The device further includes a spacer foot physically connected to a base sidewall portion of the bottom S/D region and a buried S/D contact physically connected to an upper sidewall portion of the bottom S/D region.

In another embodiment another semiconductor device is presented. The device includes a fin pair that includes a first fin and a second fin. The first fin has a first bottom channel portion, a first top channel portion, and a first channel isolator between the first bottom channel portion and the first top channel portion. The second fin has a second bottom channel portion, a second top channel portion, and a second channel isolator between the second bottom channel portion and the second top channel portion. The device includes a source and drain stack with a bottom source or drain (S/D) region connected to the first bottom channel portion and to the second bottom channel portion, a top S/D region connected to the first top channel portion and to the second top channel portion, and a source-drain isolator between the bottom S/D region and the top S/D region. The device further includes a spacer foot physically connected to a base sidewall portion of the first bottom S/D region and a buried S/D contact physically connected to an upper sidewall portion of the first bottom S/D region.

In yet another embodiment of the present invention, a semiconductor device fabrication method is presented. The method includes forming a spacer pair upon a substrate. The method further includes forming a fin trench between the spacer pair. The fin trench exposes a sidewall of a bottom fin channel region, exposes a sidewall of a top fin channel region, and exposes a sidewall of a fin channel isolator between the bottom fin channel region and the top fin channel region. The method further includes forming a bottom source or drain (S/D) region within the fin trench between the spacer pair and upon the exposed sidewall of the bottom channel region. The method further includes forming a source-drain isolator within the fin trench between the spacer pair and upon the bottom S/D region. The method further includes forming a top S/D region within the fin trench between the spacer pair and upon the source-drain isolator and forming a spacer foot by partially recessing at least one spacer of the spacer pair.

These and other embodiments, features, aspects, and advantages will become better understood with reference to the following description, appended claims, and accompanying drawings.

DETAILED DESCRIPTION

Figure 1:
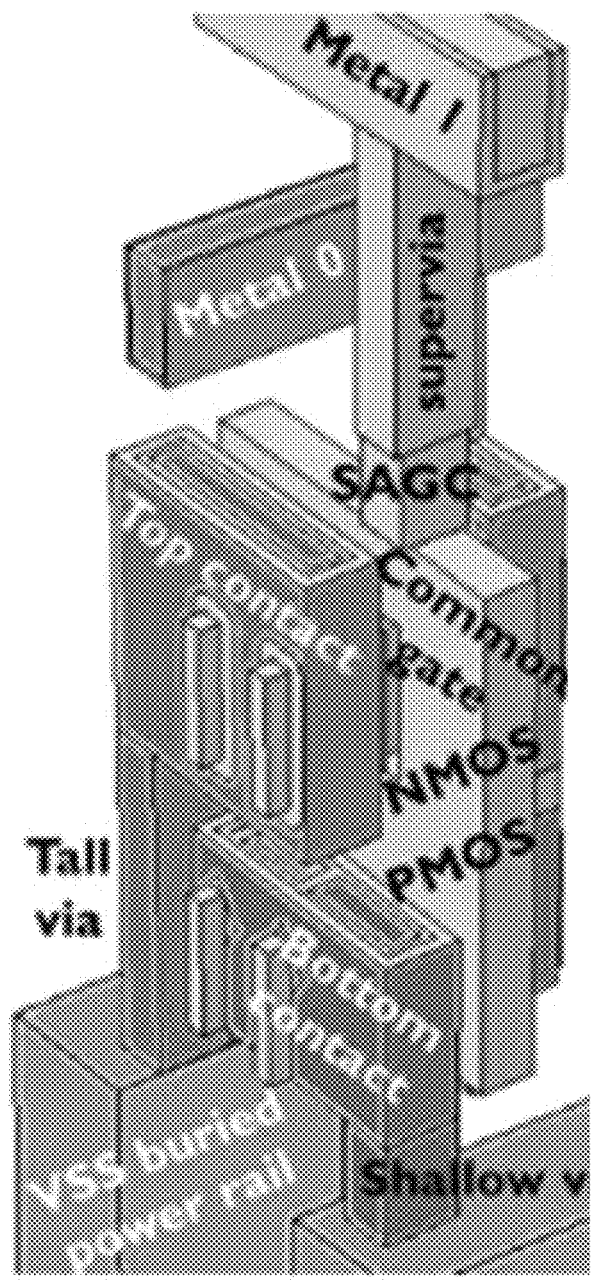
FIG. 1 depicts an isometric view of a prior art semiconductor device that includes a known CFET.

It is understood in advance that although a detailed description is provided herein of an exemplary CFET architecture that is formed having a top source or drain (S/D) region over an bottom S/D region (e.g., a NFET S/D region over a PFET S/D region, or vice versa), a spacer foot upon a sidewall of the bottom S/D region, and a buried sidewall contact that physically connects a sidewall of the bottom S/D region and a buried power rail, implementation of the teachings recited herein are not limited to the particular FET architecture described herein. Rather, embodiments of the present invention are capable of being implemented in conjunction with any other appropriate type of FET device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element,"

means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

One or more embodiments of the invention also provide fabrication methods and resulting CFET structures that may be formed with the top S/D region over the bottom S/D region, the spacer foot upon the sidewall of the bottom S/D region, and the buried contact that physical connects the bottom S/D region and the buried power rail. The spacer foot may prevent shorting between the buried contact and the semiconductor substrate. Such fabrication methods and resulting semiconductor device structures, in accordance with embodiments of the invention, are described in detail below by referring to the accompanying drawings.

FIG. 1 depicts an isometric view of a prior art semiconductor device that includes a known CFET. A CFET is a version of a gate-all-around semiconductor device. In a CFET, one transistor (nFET or pFET) is stacked over another transistor (pFET or nFET). For example, a CFET could stack one nFET on top of a pFET transistor, one pFET on top of a NFET transistor, or the like. This folding of the nFET and pFET may eliminate the n-to-p separation bottleneck, reducing the cell active area footprint and increasing overall efficiency of the device.

Figure 2:
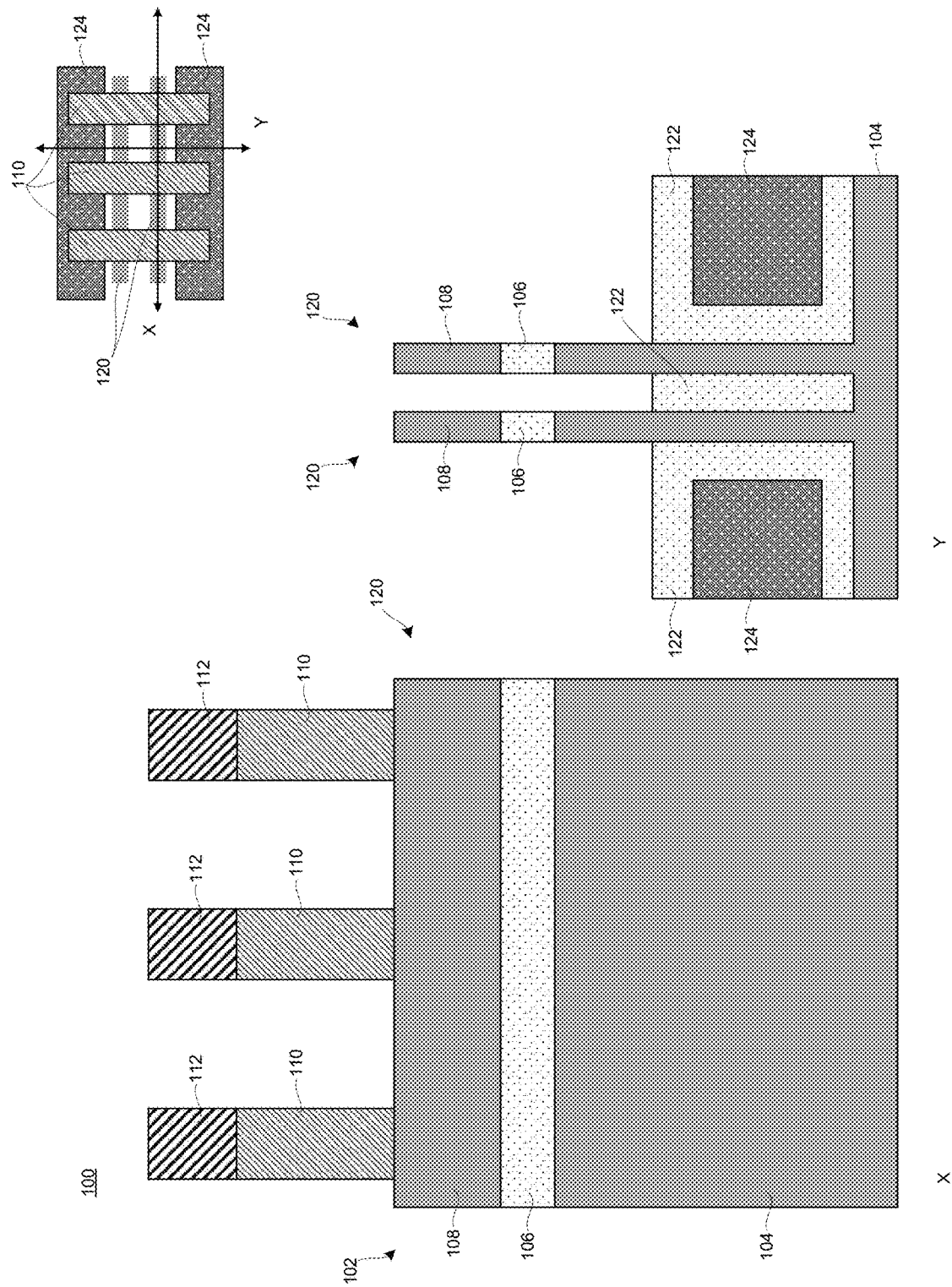
FIG. 2 through FIG. 15 depict cross-sectional views of a semiconductor device shown after respective fabrication operations, in accordance with one or more embodiments.

FIG. 2 depicts cross-sectional views of a semiconductor device 100 shown after fabrication operations, in accordance with one or more embodiments. Semiconductor device 100 is depicted in FIG. 2 though FIG. 15 at various fabrication stages that may form a top S/D region 144 over a bottom S/D region 140, both shown for example in FIG. 6, a spacer foot 132', shown for example in FIG. 8, upon a sidewall of the bottom S/D region 140, and a buried sidewall contact 176, shown for example in FIG. 14, that physically connects the sidewall of a bottom S/D region 140 to a buried power rail 124.

The cross-section views of the depicted semiconductor device structures depicted in FIG. 2 through FIG. 15 are defined by the cross-sectional planes depicted in FIG. 2 and are used throughout the remaining structural drawings.

After associated fabrication operations, semiconductor device 100 may include a substrate 102, one or more channel fins 120, hereinafter referred to as fins 120, one or more shallow trench isolation (STI) regions 122, one or more buried power rails 124, one or more sacrificial gates 110 with a gate mask 112 thereupon.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk semiconductor material. Alternatively, as depicted, the substrate 102 may be substrate on insulator (e.g., silicon on insulator (SOI), or the like) that may include a substrate 104, such as a Si substrate 104, an insulator 106, such as a SiO insulator, upon the substrate 104, and a semiconductor layer 108, such as a Si semiconductor layer 108, upon the insulator 106.

Utilizing known patterning, lithography, etching, etc. techniques, undesired portions of the substrate 102 may be removed while desired portions thereof may be retained and may form fins 120. Fins can be patterned by conventional patterning techniques, such as Self-Aligned Double Patterning (SADP), Self-Aligned Quadruple Patterning (SAQP), etc.

STI regions 122, or portion(s) thereof, may be formed by depositing STI material(s), such as a dielectric known in the art, upon the substrate 102 and upon and between fins 120. The STI regions 122 may be formed by depositing the STI material by for example, PVD, CVD, ALD, or the like, followed by chemical mechanical polish (CMP). As is known in the art, STI regions 122 may, at least partially, electrically isolate neighboring CFET components or features. Exemplary STI region 122 material(s) may be a thin layer of conformal SiN and SiO2 over fill.

Utilizing known patterning, lithography, etching, etc. techniques, buried power rail trenches may be defined within the STI regions 122, or portion(s) thereof.

A buried power rail 124 may be formed within a buried power rail trench. Buried power rail 124 may be formed by depositing a metal adhesion layer, such as a Titanium Nitride (TiN) adhesion layer, followed by depositing conductive buried power rail metal, such as Cobalt (Co), Tungsten (W), Ruthenium (Ru), Copper (Cu), etc., by PVD, CVD, ALD, plating, or the like. Subsequently, the buried power rail metal may be planarized by CMP and/or recess. Subsequently, additional STI 122 material may be deposited upon the buried power rail(s) 124 and the STI dielectric may be recessed as desired. In some embodiments, a top surface of the STI region(s) 122, after recess, may be below a bottom surface of insulator 106 within fin 120. In some embodiments, exposed fin 120 surfaces above insulator 106 (e.g., exposed fin 120 semiconductor layer 108 portions) define a top channel of a top FET, and exposed fin 120 surfaces below insulator 106 (e.g., exposed fin 120 semiconductor layer 104 portions) defines a bottom channels of a bottom FET.

Sacrificial gates 110 may be formed upon STI region(s) 122 and upon and between fins 120. Sacrificial gates 110 may be formed by depositing sacrificial gate material, materials, or layers of material(s), by PVD, CVD, ALD, or the like. Exemplary sacrificial gate 110 materials may be a thin silicon oxide layer followed by amorphous-Si or poly-Si.

In some embodiments, a sacrificial gate 110 material layer may be formed upon STI region(s) 122 and upon and between fins 120. Subsequently a gate mask 112 layer may be formed upon the sacrificial gate 110 material layer. The gate mask 112 layer may be a hard mask layer. Exemplary mask 112 layer materials may be silicon nitride (SiN), a combination of SiN and Silicon Dioxide ($SiO_2$), or the like.

Utilizing known patterning, lithography, etching, etc. techniques, undesired portions of the gate mask 112 may be removed, followed by further removal of the sacrificial gate 110 material layer that is not covered by the gate hard mask, while desired portions of sacrificial gate 110 material layer and associated desired portions of the gate mask 112 layer may be retained. These retained features may respectively form sacrificial gates 110 with a gate mask 112 thereupon. The combined structure of the sacrificial gate 110 and the associated gate mask 112 may be referred herein as a sacrificial gate structure.

Figure 3:
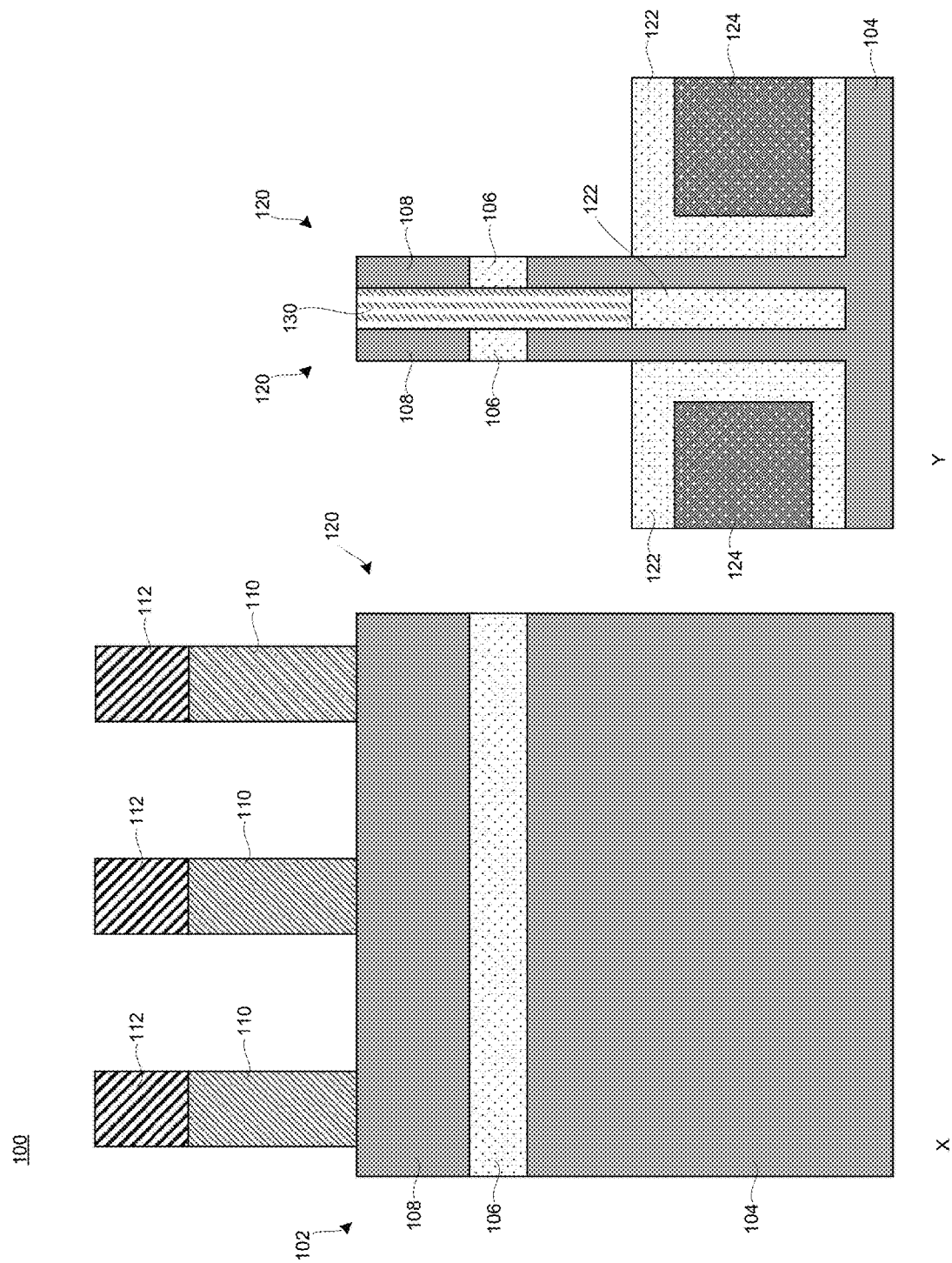

FIG. 3 depicts cross-sectional views of semiconductor structure 100 shown after a fabrication operation, in accordance with one or more embodiments. At the present fabrication operation, sacrificial plug 130 may be formed to pinch-off or otherwise fill region(s) between fins 120 that are not covered by sacrificial gates 110.

Sacrificial plug 130 may be formed by depositing a conformal material by ALD, or the like. Exemplary sacrificial plug 130 materials may be but are not limited to: Titanium Oxide ($TiO_x$), Aluminum oxide ($AlO_x$), SiC, or the like.

Sacrificial plug 130 may be formed between fins 120 upon the top surface of STI region 122. The upper surface of sacrificial plug 130 may be substantially coplanar with the top surface of the associated or physically connected fins 120. Such coplanarity may be achieved by initially depositing (e.g., ALD) sacrificial plug 130 material to completely fill the narrow fin 120 to fin 120 space followed by isotropic etching back the sacrificial plug material 130, such that excess sacrificial plug 130 material is removed but for the sacrificial plug 130 material within the cavity above STI region 122 between respective facing sidewalls of neighboring fins 120.

Figure 4:
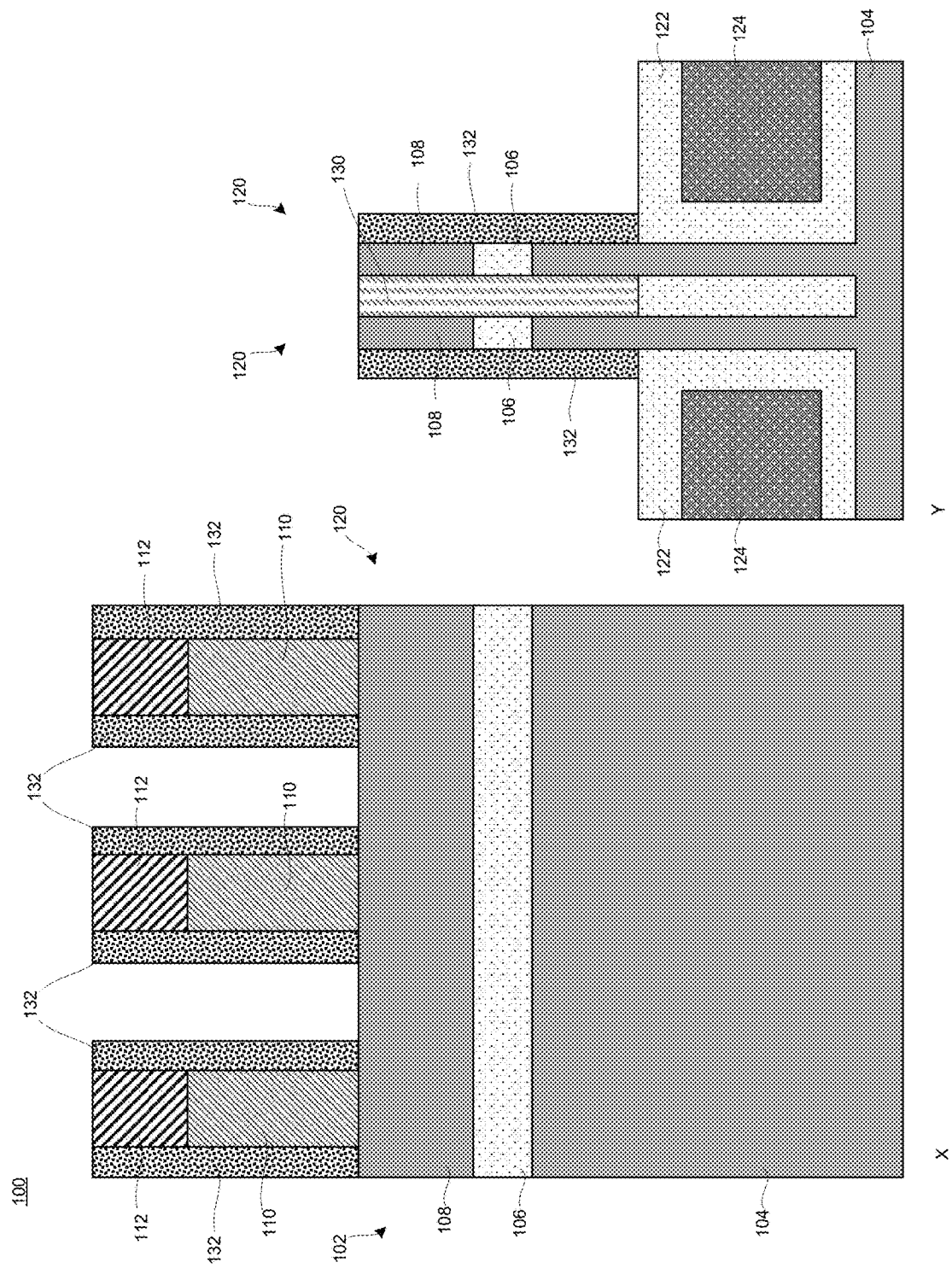

FIG. 4 depicts cross-sectional views of semiconductor structure 100 shown after a fabrication operation, in accordance with one or more embodiments. At the present fabrication operation, spacer 132 may be form upon fins 120 sidewall(s) and upon the sacrificial gate structure sidewall(s).

Spacer 132 may be formed by depositing a conformal dielectric material by CVD, ALD, or the like. Exemplary spacer 132 materials may be but are not limited to: SiN, SiBCN, SiOCN, SiOC, or the like.

Spacer 132 may be formed by depositing a layer of spacer 132 material(s) upon STI regions 122, upon and around fins 120, upon sacrificial plug 130, and upon and around the sacrificial gate structures.

The spacer 132 layer can have a thickness of from about 5 nm to about 15 nm, although other thicknesses are within the contemplated scope. The spacer 132 layer can be a low-k material having a dielectric constant less than about 7, less than about 5, or the like. After spacer 132 deposition, horizontal portions of spacer 132 layer may be removed by, for example, an anisotropic etching process, while desired portions of spacer 132 layer may be retained to form spacers 132. The formed spacers 132 may therefore be effectively formed upon the vertical sidewalls of the sacrificial gate structures and upon the vertical sidewalls of the fins 120.

Figure 5:
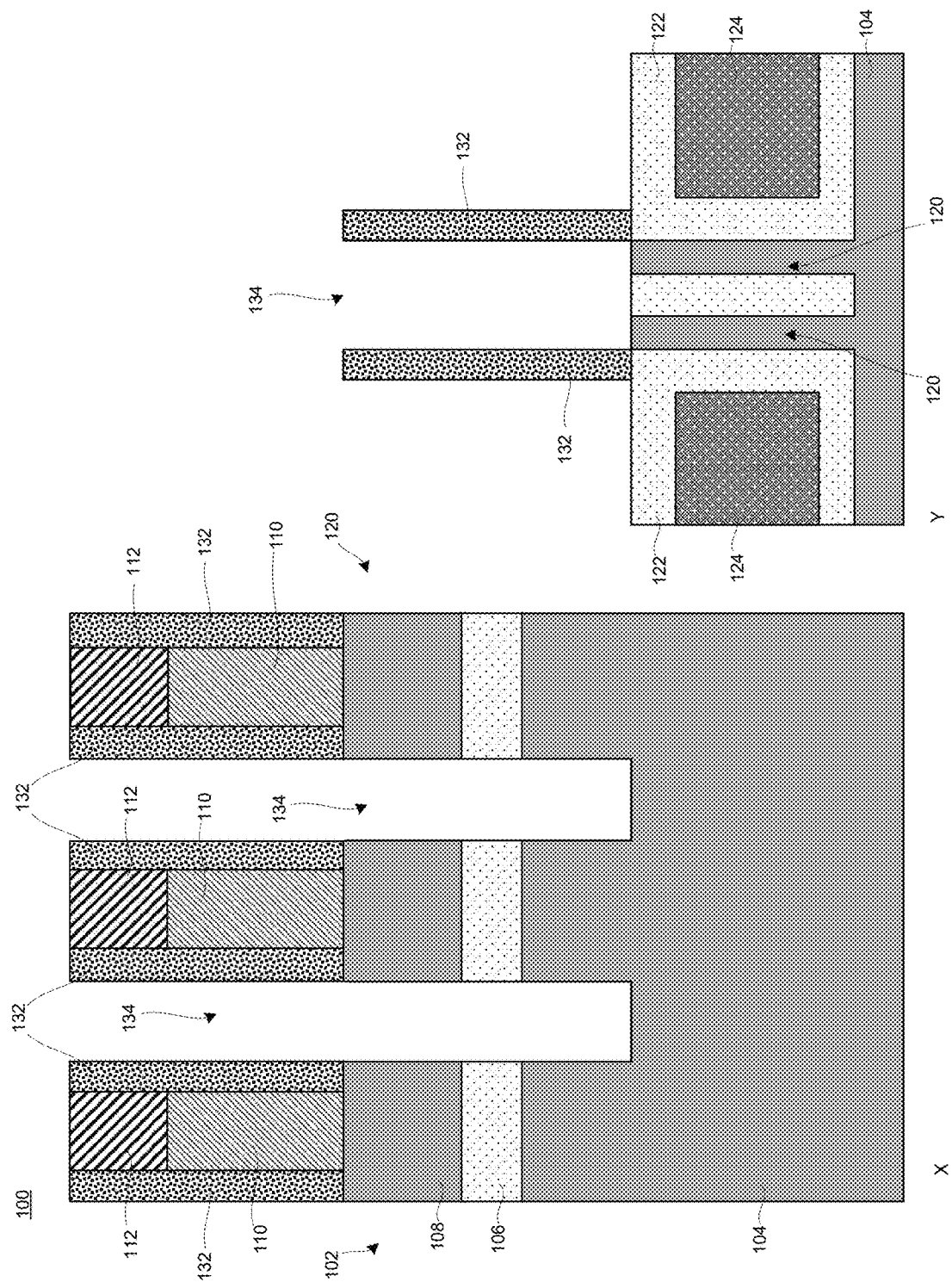

FIG. 5 depicts cross-sectional views of semiconductor structure 100 shown after a fabrication operation, in accordance with one or more embodiments. At the present fabrication operation, a fin trench 134 may be formed by partially recessing fins 120 and removing sacrificial plug 130 between spacers 132. The fin trench 134 may be a cavity or recess formed within fins 120.

Undesired portions of fins 120 and sacrificial plug 130 may be removed by known patterning, lithography, and etching techniques. In some embodiments, the undesired portions of fins 120 and sacrificial plug 130 may be removed between facing spacers 132 of neighboring sacrificial gate structures in the X cross section and may be removed between spacers 132 in the Y cross section, as depicted. The bottom surface of fin trench 134 may be coplanar with the top surface of STI region(s) 122. As the fins 120 may be recessed by fin trench 134, the top surface of fins 120 may also be coplanar with the top surface of STI regions 122.

The fin trench 134 may expose respective facing vertical sidewalls of spacers 132, may form a bottom well surface and respective facing vertical sidewalls of substrate 104, may form respective facing vertical sidewalls of insulator 106, and may form respective facing vertical sidewalls of semiconductor layer 108. Such respective vertical sidewalls may be coplanar with the outward sidewall of spacer 132 associated with a sacrificial gate structure, there above.

Figure 6:
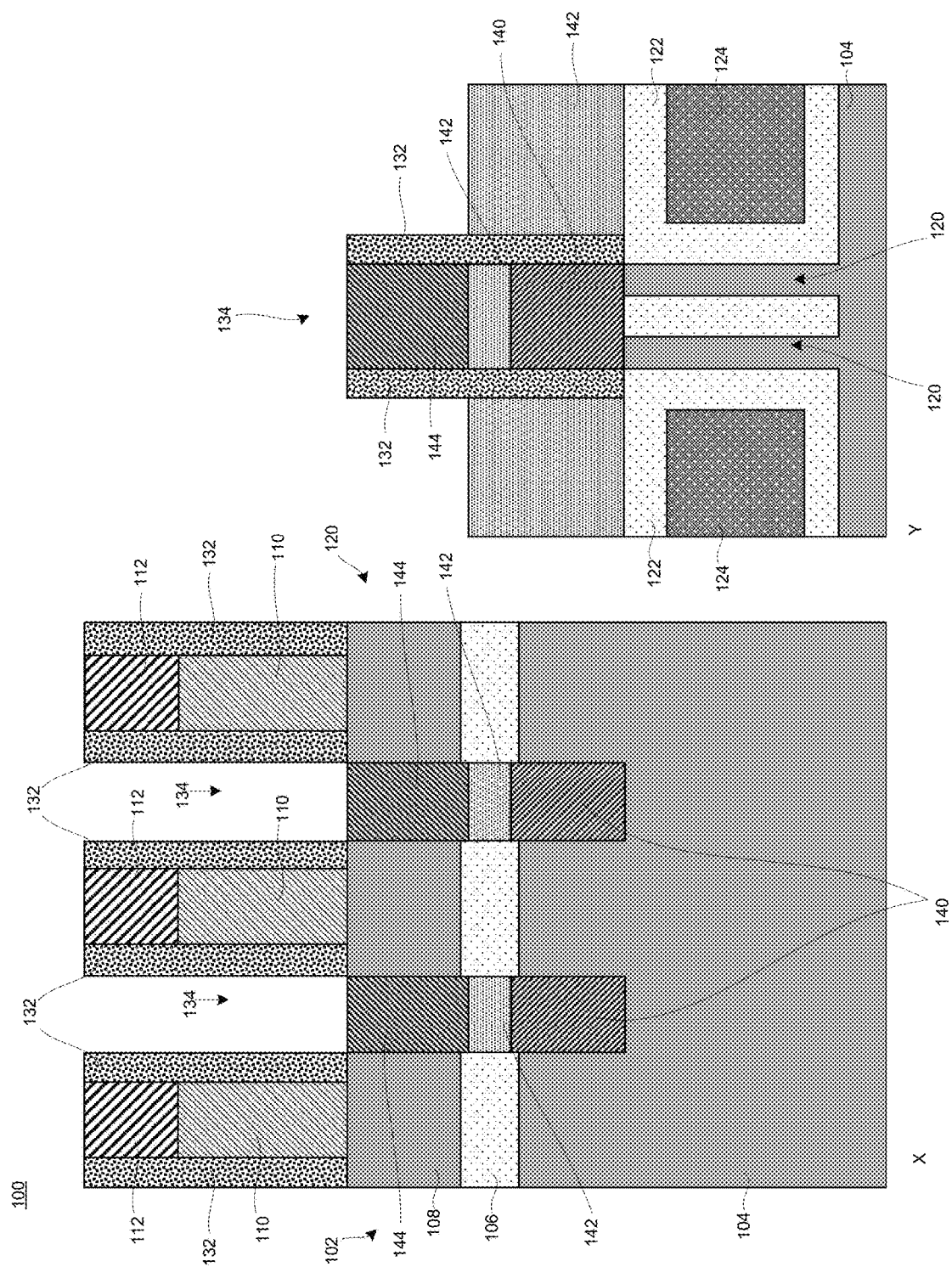

FIG. 6 depicts cross-sectional views of semiconductor structure 100 shown after a fabrication operation, in accordance with one or more embodiments. At the present fabrication operation, a bottom S/D region 140 and a top S/D region 144 may be formed within fin trench 134.

The bottom S/D region 140 may be epitaxially formed upon exposed semiconductor surfaces (e.g., substrate 104 and semiconductor layer 108) followed by a S/D epitaxy material recess to remove S/D epitaxy material that grew over semiconductor layer 108 of fins 120. Subsequently, a S/D isolator 142 may be deposited over the bottom S/D region 140 followed by S/D isolator 142 material recess to expose the sidewall of semiconductor layer 108. Subsequently, the top S/D region 144 may be formed upon the exposed fin surfaces 108.

In some embodiments, the top surface of the bottom S/D region 140 is above the top surface of substrate 104, is substantially coplanar with the top surface of substrate 104 or is coplanar with the top surface of substrate 104. Similarly, the bottom surface of the top S/D region 144 is below the bottom surface of substrate 108, is substantially coplanar with the bottom surface of substrate 108 or is coplanar with the bottom surface of substrate 108. As such, the top surface and bottom surface of S/D isolator 142 may be between the top surface and bottom surface of insulator 106.

In other embodiments, the top surface of the bottom S/D region 140 is below the top surface of substrate 104. Similarly, the bottom surface of the top S/D region 144 is above the bottom surface of substrate 108. As such, the top surface and bottom surface of insulator 106 may be between the top surface and bottom surface of isolator 142.

In some embodiments, the bottom S/D region 140 and top S/D region 144 may be formed within the fin trench 134 by epitaxially growing S/D material from one or more exposed semiconductor surface(s) (e.g., substrate 104 and semiconductor layer 108). Exemplary S/D region 140/144 materials may be but are not limited to: Si, Ge, SiGe, SiC, or the like.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial Si, SiGe, and/or SiC can be doped during deposition (in-situ doped) by adding dopants, n-type dopants (e.g., phosphorus or arsenic) or p-type dopants (e.g., boron or gallium), depending on its inclusion within the pFET or the nFET.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material can include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

S/D isolator 142 may be formed within fin trench 134 upon the bottom S/D region 140 between spacers 132 and between insulator 106. S/D isolator 142 may be formed by depositing a dielectric material, materials, or layers of material(s), by PVD, CVD, ALD, or the like. Exemplary S/D isolator 142 materials may be $SiO_2$, a combination of a thin SiN liner and $SiO_2$, or the like. In some embodiments, the S/D isolator 142 material is chosen such that the material may electrically isolate, adequately electrically isolate, or the like, the bottom S/D region 140 from the top S/D region 144.

In some embodiments, as depicted, a S/D isolator 142 material layer may be formed within fin trench 134 upon the bottom S/D region 140 between spacers 132 and between insulator 106 and may be formed upon STI regions 122 and upon sidewall(s) of spacer 132. The S/D isolator 142 material layer thickness may be chosen so that the S/D isolator 142 material layer has a top surface that is coplanar, substantially coplanar, or below the bottom surface of semiconductor layer 108.

Figure 7:
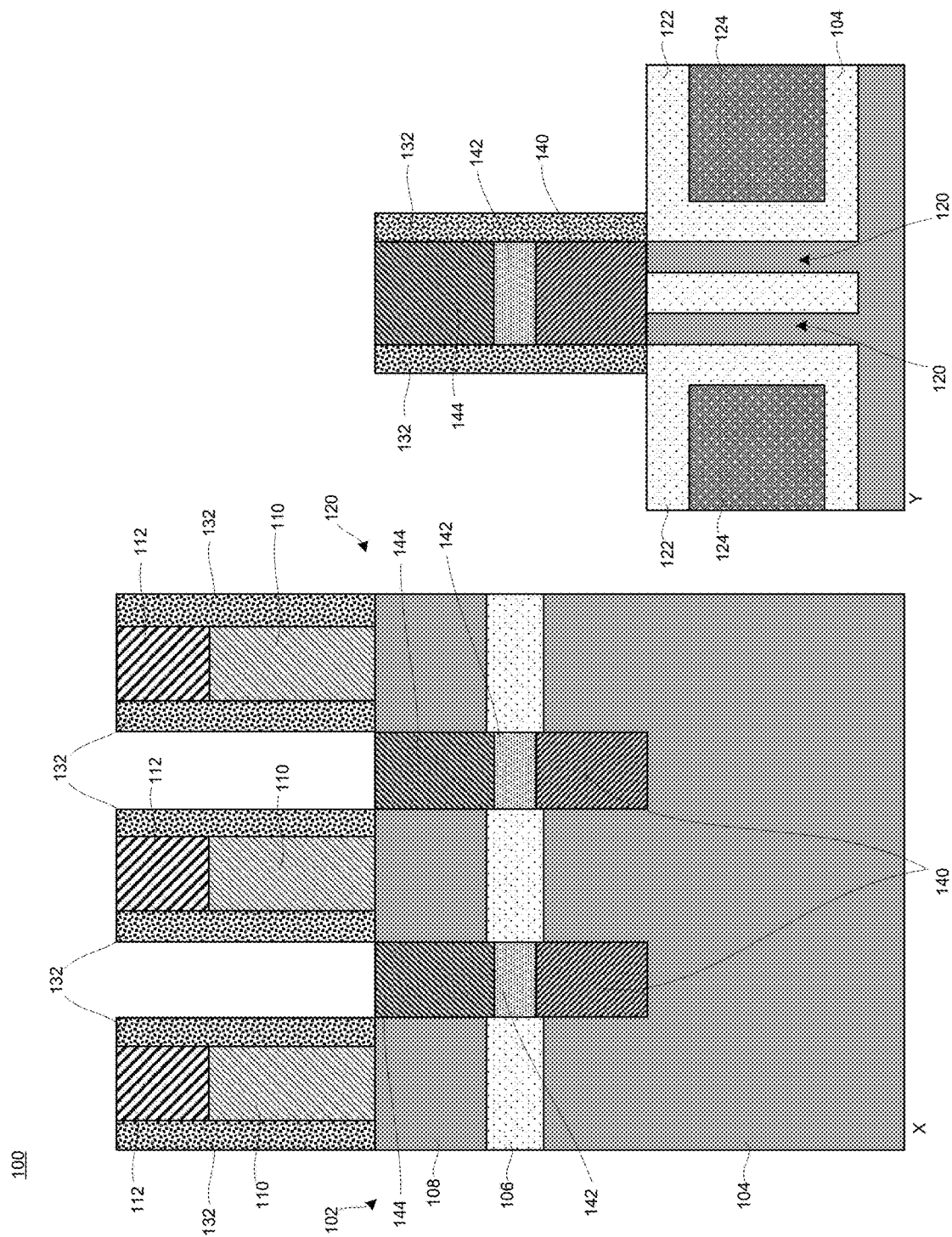

FIG. 7 depicts cross-sectional views of semiconductor structure 100 shown after a fabrication operation, in accordance with one or more embodiments. At the present fabrication operation, the S/D isolator 142 material layer outside of fin trench 134 may be removed while the S/D isolator 142 material layer within fin trench 134 is retained, thereby forming S/D isolator 142.

Utilizing known patterning, lithography, etching, etc. techniques, undesired portions of the S/D isolator 142 material layer may be removed, while desired portions of the S/D isolator 142 material layer may be retained. These retained features may respectively form S/D isolator 142 that is between and at least partially electrically isolates the bottom S/D region 140 and the top S/D region 144. The fabricated stack of the bottom S/D region 140, the S/D isolator 142, and the top S/D region 144 may be referred herein as the S/D region stack.

Figure 8:
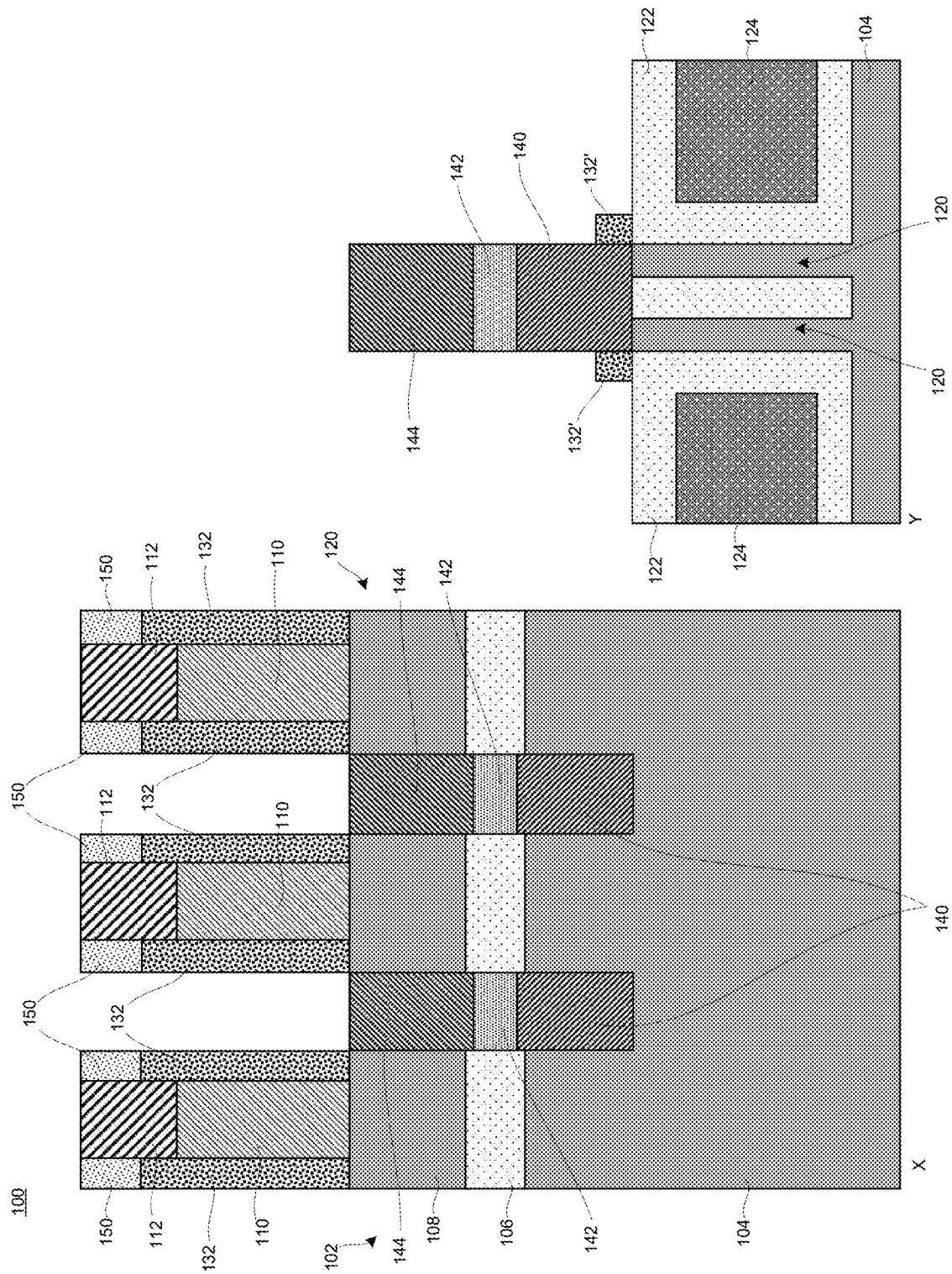

FIG. 8 depicts cross-sectional views of semiconductor structure 100 shown after a fabrication operation, in accordance with one or more embodiments. At the present fabrication operation, spacer 132 around the sacrificial gate structure(s) may be protected while spacer 132 associated with the S/D region stack may be partially recessed.

The spacer 132 around the sacrificial gate structure(s) may be protected by partially recessing the spacer 132 around the sacrificial gate structure(s) and forming a spacer cap 150 thereupon around the sacrificial gate structure(s). In such process, a sacrificial material, such as OPL, can be formed followed by OPL recess, so spacers 132 that are upon respective sidewall(s) of S/D region 140 and S/D region 144 are protected by the OPL, while top portions of spacer 132 that are upon sidewall(s) of sacrificial gate structure(s) may be exposed and removed.

Subsequently, spacer cap 150 may be formed by depositing a conformal liner, such as $TiO_x$, $AlO_x$, $SiO2$, SiCO, or SiC, or the like, upon the spacer 132 around the sacrificial gate structure(s), followed by an anisotropic etch to remove the spacer cap 150 from horizontal surface(s). Next, the sacrificial OPL can be removed, e.g. by N2/H2 ash, or the like. The spacer cap 150 may stop further recessing or removal of the spacer 132 around the sacrificial gate structure(s). Such localized ceasing of the removal of the spacer 132 around the sacrificial gate structure(s) allows this spacer 132 to be retained, where desired, while allows for the spacer 132 upon the sidewall(s) the S/D region stack to be further recessed. The spacer 132 upon the sidewall(s) of the S/D region stack may be further recessed by an anisotropic etching process. A portion of the spacer 132 that is upon the STI region(s) 122 and upon the sidewall(s) of the S/D region stack (e.g., upon the sidewall of bottom S/D region 140) may be retained and forms spacer foot 132'.

Figure 9:
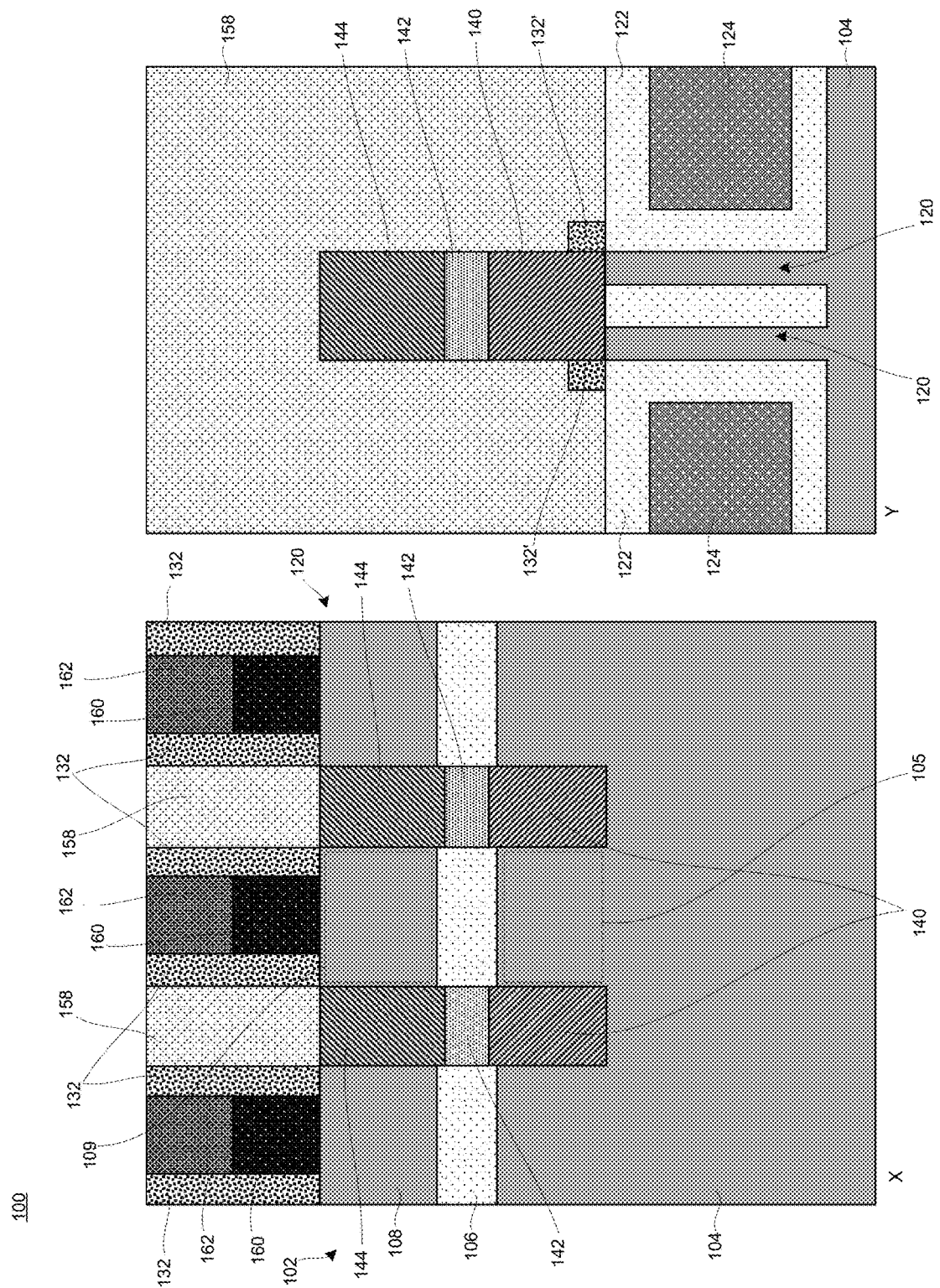

FIG. 9 depicts cross-sectional views of semiconductor structure 100 shown after a fabrication operation, in accordance with one or more embodiments. At the present fabrication operation, a sacrificial interlayer dielectric (ILD) 158 may be formed, sacrificial gate structures may be removed, and replacement gate structures may be formed in place thereof.

The sacrificial ILD 158 may be formed by depositing a dielectric material by PVD, CVD, ALD, or the like. Exemplary ILD 158 material(s) may be but are not limited to: $SiO_2$, a thin liner of SiN followed by $SiO_2$, amorphous Si, or the like.

ILD 158 may be formed within crevasses, trenches, or the like, within semiconductor structure 100. For example, ILD 158 may be formed within a trench upon a between spacers 132 of neighboring sacrificial gate structures and within fin trenches 134 around the S/D region stack and upon the spacer foot 132'. Subsequently, the top surface of semiconductor structure 100 may be planarized by, e.g., a CMP, or the like. For example, the respective top surfaces of ILD(s) 158, spacers 132, sacrificial gate structures, etc. may be coplanar.

Sacrificial gate structure(s) (e.g., mask 112 and sacrificial gate 110) may be removed by known patterning, lithography, etching, etc. techniques and may form a replacement gate trench. The replacement gate trench may expose at least a portion of a sidewall or side surface of the fins 120. For example, the replacement gate trench may expose at least a portion of the sidewall or side surface of substrate 108, isolator 106, and substrate 104 of the fins 120.

A replacement gate structure may be formed by depositing a gate dielectric liner, by depositing work function metal(s) 160, recessing the work function metal(s) 160 (if needed), followed by forming a gate cap 162 material by PVD, CVD, ALD, or the like, within a replacement gate trench. Exemplary gate dielectric materials may be but are not limited to: $SiO_2$, $HfO_2$, $ZrO_2$, $HfZrO_2$, HfAlOx, HfSiOx, or the like. Exemplary work function metal 160 materials may be but are not limited to: TiN, TiC, TiAlC, TaN, or the like. After work function metal 160 deposition, a low resistance conductive gate metal, such as W or Al, can be further deposited. Exemplary gate cap 162 material may be but are not limited to: Nitride, SiBCN, SiOCN, SiOC, or the like.

The replacement gate structure may be formed around the fins 120, such that the replacement gate structure is formed around or upon the exposed portions of the fins 120 sidewalls or side surfaces (e.g., formed upon substrate 108, isolator 106, and substrate 104). As such the replacement gate structure may serve as a common gate to two vertically stacked FETs. For example, the replacement gate structure may be the common gate to a top FET that includes top S/D regions 144 and fins 120 channel regions 109 therebetween and a bottom FET that includes bottom S/D regions 140 and fins 120 channel regions 105 therebetween.

Figure 10:
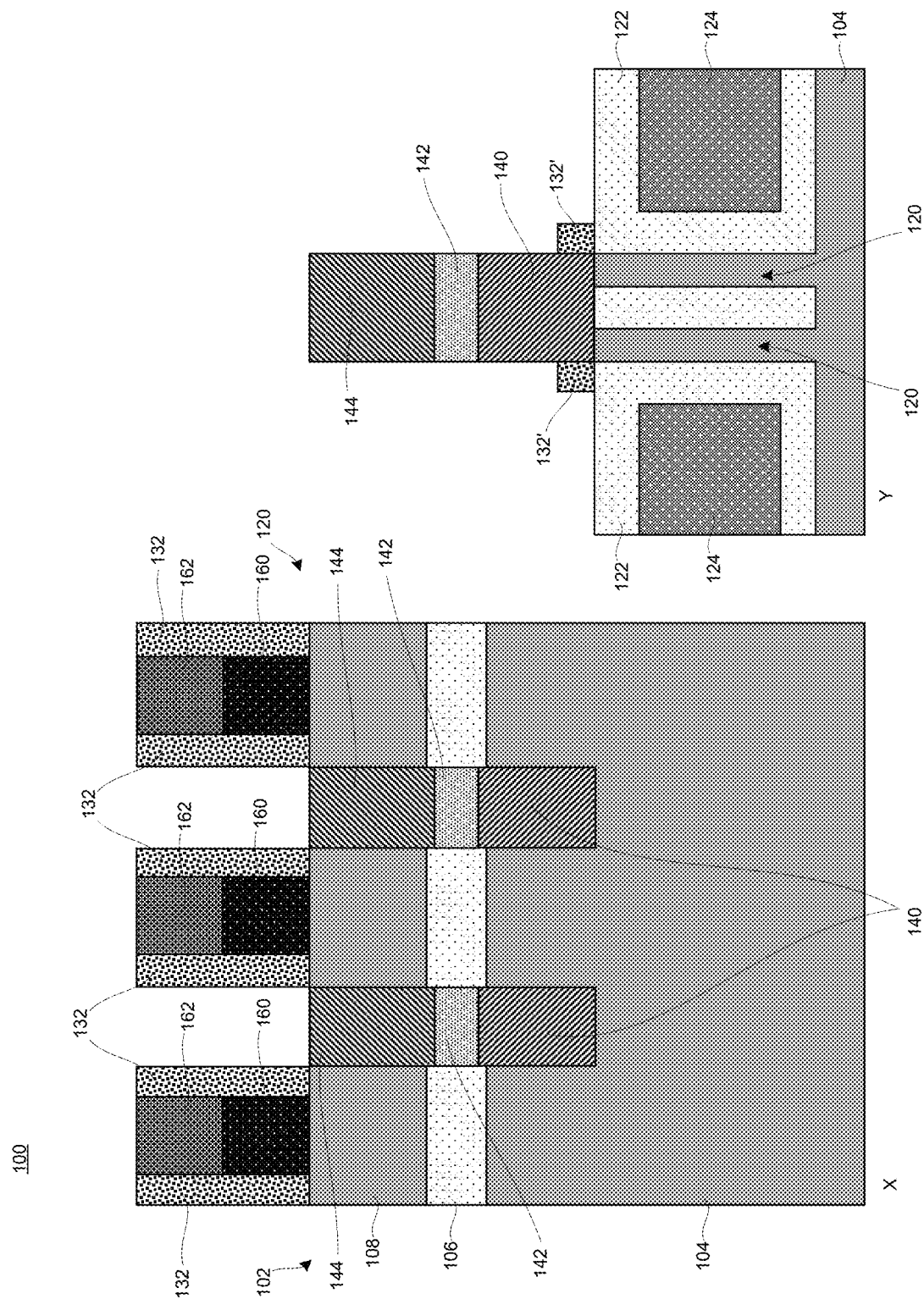

FIG. 10 depicts cross-sectional views of semiconductor structure 100 shown after a fabrication operation, in accordance with one or more embodiments. At the present fabrication operation, sacrificial ILD 158 may be removed. Utilizing known patterning, lithography, etching, etc. techniques, sacrificial ILD 158 may be removed thereby exposing the underlying semiconductor structure 100 there below. For example, the sacrificial ILD 158 between neighboring replacement gate structures and upon the top S/D region 144 may be removed to expose the neighboring replacement gate structure spacers 132, to expose the top S/D region 144, to expose the bottom S/D region 140, etc. Similarly, the sacrificial ILD 158 upon STI regions 122, upon the spacer foot 132', and around the S/D region stack may be removed to expose the STI regions 122, expose the spacer foot 132', etc.

Figure 11:
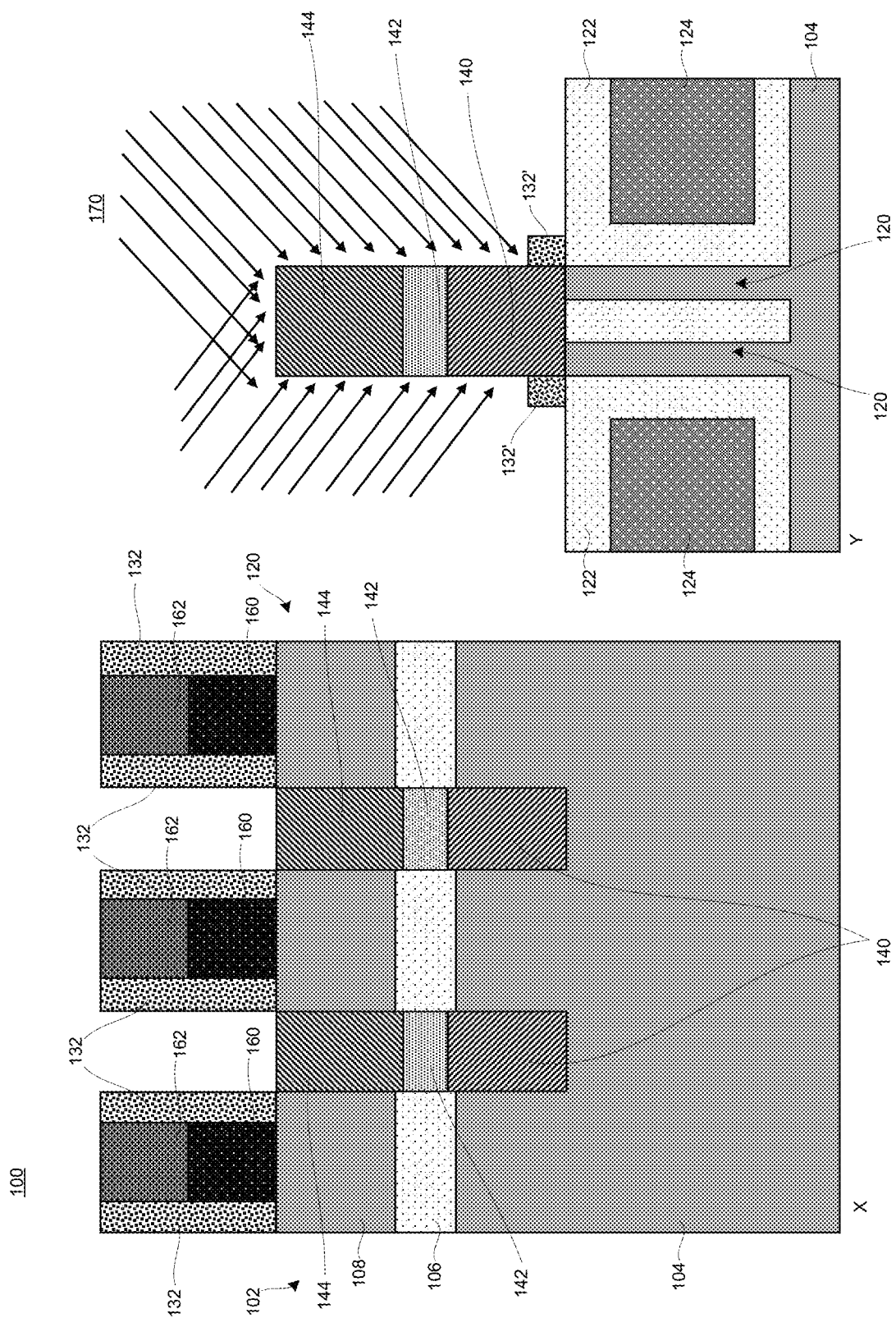
Figure 15:
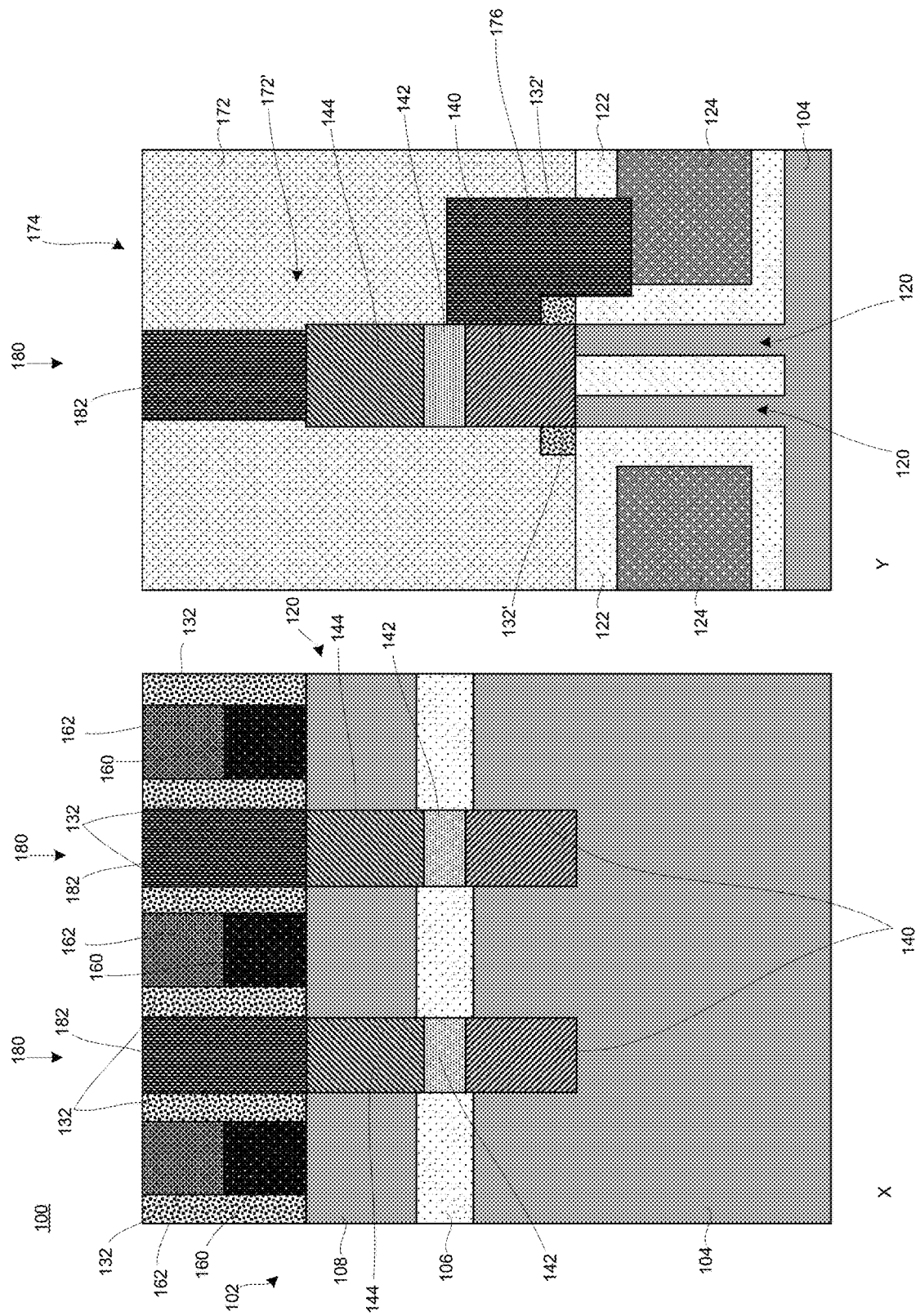

FIG. 11 depicts cross-sectional views of semiconductor structure 100 shown after a fabrication operation, in accordance with one or more embodiments. At the present fabrication operation, the S/D region stack may be cleaned and appropriate S/D region 140, 144 treatments may be implanted. For example, after bottom S/D region 140 and top S/D region 144, including sidewall(s) thereof, are exposed, a pre-amorphization implantation to such regions may be applied. For example, a Si, Ge, Xe implantation may be applied to bottom S/D region 140, top S/D region 144, as appropriate, to amorphize the surface(s) thereof. The surface amorphization may reduce the electrical resistance between such respective regions and a S/D contact associated therewith, such as S/D contact 176 or contact 182 as depicted in FIG. 15.

Figure 12:
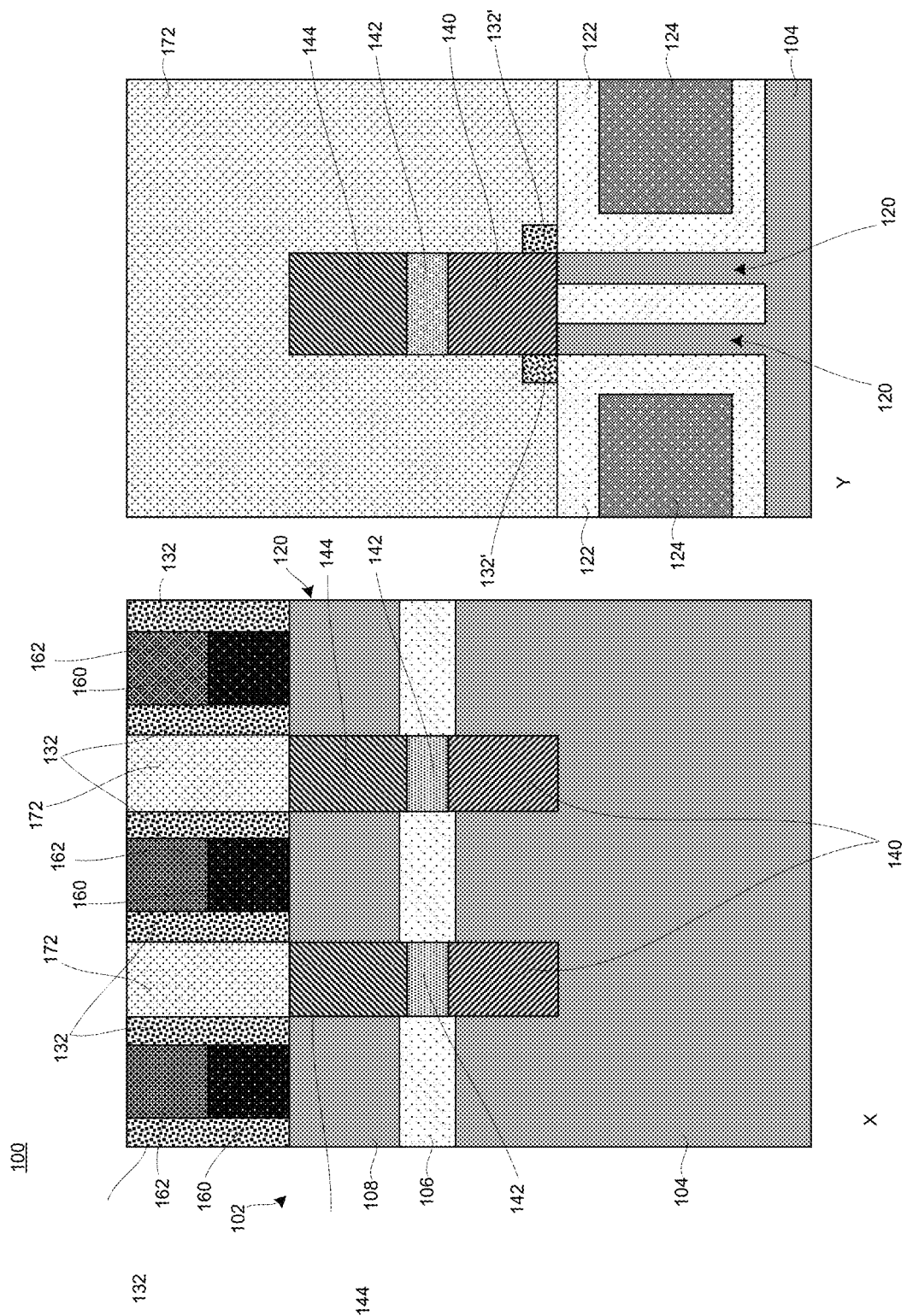

FIG. 12 depicts cross-sectional views of semiconductor structure 100 shown after a fabrication operation, in accordance with one or more embodiments. At the present fabrication operation ILD 172 may be formed. The ILD 172 may be formed by depositing a dielectric material by PVD, CVD, ALD, or the like. Exemplary ILD 172 material(s) may be but are not limited to: $SiO_2$, a thin liner of SiN followed by $SiO_2$, or the like.

ILD 172 may be formed within crevasses, trenches, or the like, within semiconductor structure 100. For example, ILD 172 may be formed within a trench between spacers 132 of neighboring replacement gate structures, formed around the S/D region stack and formed upon the spacer foot 132'. Subsequently, the top surface of semiconductor structure 100 may be planarized by, e.g., a CMP, or the like. For example, the respective top surfaces of ILD(s) 172, spacers 132, replacement gate structures (e.g., top surface of gate cap 162), etc. may be coplanar.

Figure 13:
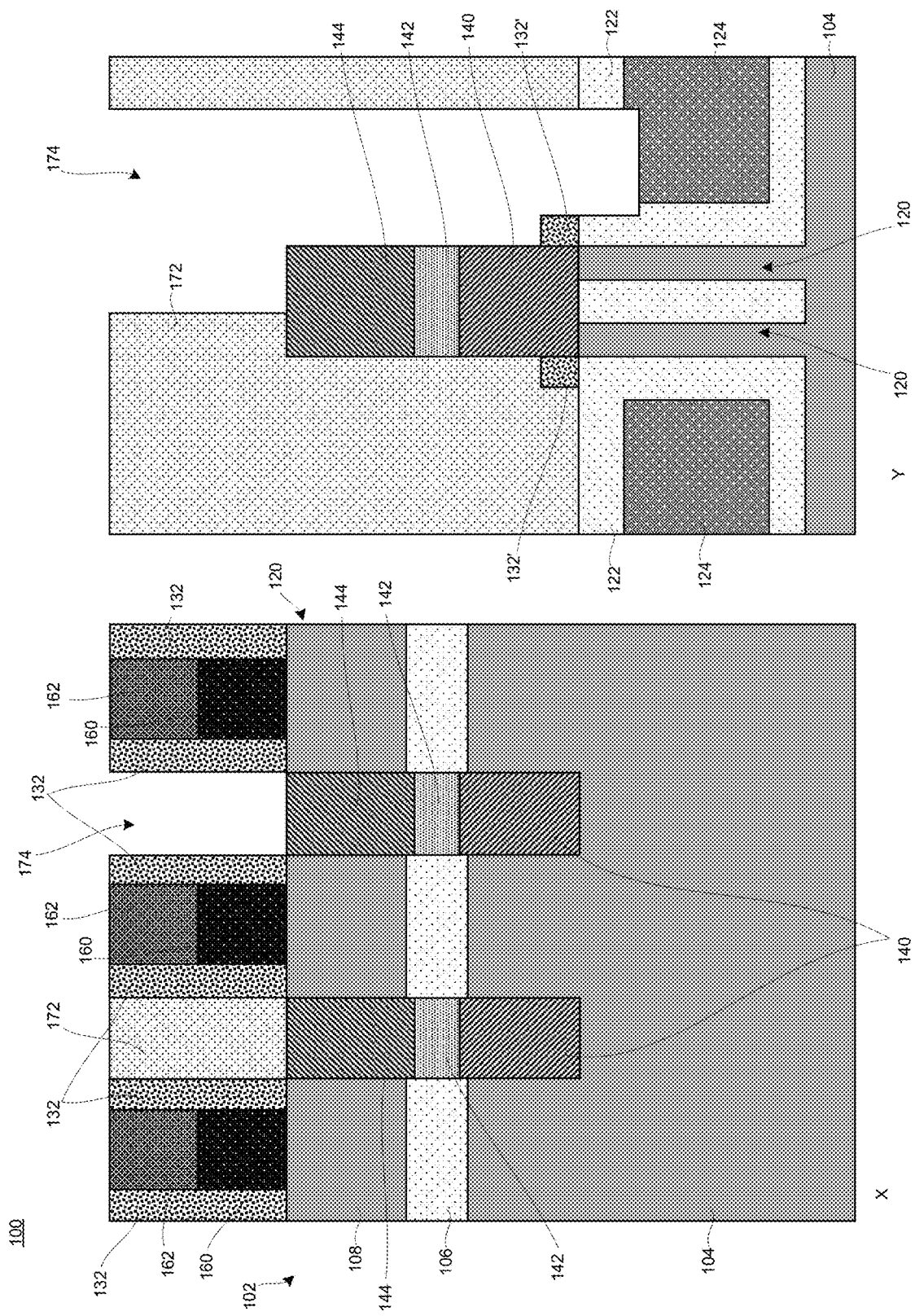

FIG. 13 depicts cross-sectional views of semiconductor structure 100 shown after a fabrication operation, in accordance with one or more embodiments. At the present fabrication operation, metallization contact trench 174 may be formed within ILD 172.

Undesired portions ILD 172 may be removed, to thereby form metallization contact trench 174, by known patterning, lithography, and etching techniques to expose at least a portion of a sidewall or side surface of bottom S/D region 140 and expose at least a portion of buried power rail 124. The metallization contact trench 174 may further expose portion(s) of STI region 122 above the exposed buried power rail 124; may further expose portion(s) of spacer foot 132'; may further expose at least a portion of a sidewall or side surface of S/D isolator 142; may further expose at least a portion of a sidewall or side surface of top S/D region 144; may further expose at least a portion of a top surface of top S/D region 144; and further expose at least a portion of respective sidewalls or side surfaces of facing spacers 132 of neighboring replacement gate structures. In some embodiments, as depicted, a portion of buried power rail 124 may be partially recessed by metallization contact trench 174.

Figure 14:
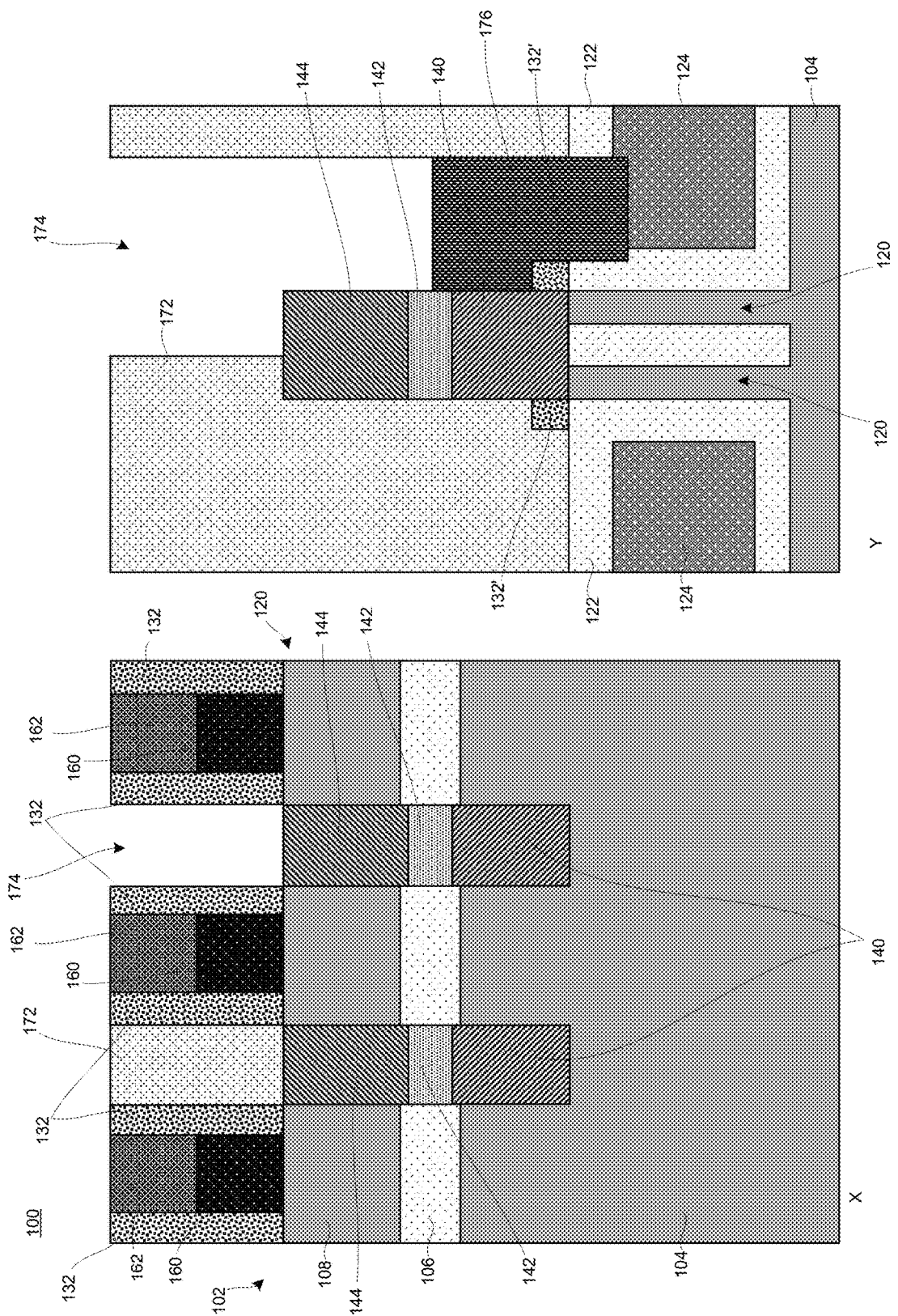

FIG. 14 depicts cross-sectional views of semiconductor structure 100 shown after a fabrication operation, in accordance with one or more embodiments. At the present fabrication operation, bottom contact metallization (BCM) 176 may be formed within metallization contact trench 174.

BCM 176 may be formed within metallization contact trench 174 upon at least a portion of the buried power rail 124 and upon at least a portion of the side surface or sidewall of bottom S/D region 140. BCM 176 may be formed within metallization contact trench 174 around the spacer foot 132'.

BCM 176 may be formed by depositing a silicide liner, followed by depositing a adhesion layer, and depositing conductive metal. Exemplary silicide liner material includes Ti, Ni, NiPt, or the like. Exemplary adhesion layer materials may be and are not limited to: TiN, TaN, or the like. Exemplary conductive metals may be and are not limited to: Co, W, Cu, Ru, or the like. After the conductive metal deposition, a metal recess may be applied to remove or planarize the top surface of the formed BCM 176.

In some embodiments, as depicted, the top surface of BCM 176 may be between the top and bottom surfaces of S/D isolator 142. In other embodiments, the top surface of BCM 176 may be below the top surface of S/D isolator 142, the top surface of BCM 176 may be below the bottom surface of S/D isolator 142, etc. In some embodiments, the distance between the top surface of BCM 176 and the top surface of S/D isolator 142 may be chosen so as to adequately electrically isolate BCM 176 from top S/D region 144 with the chosen dielectric material used to fill metallization contact trench 174, as shown in FIG. 15.

In a particular embodiment, BCM 176 is formed self-aligned to the spacer foot 132'. For example, when metallization contact trench 174 is formed, ILD 172 and STI 122 may be removed selective to the spacer foot 132', such that the bottom of the metallization contact trench 174 is away from the fin(s) 120 that are located under the bottom S/D region 140. This retained spacer foot 132' and STI region(s) 122 between the metallization contact trench 174 and these fins 120 may prevent electrical shorts between the formed BCM 176 and the fins 120.

FIG. 15 depicts cross-sectional views of semiconductor structure 100 shown after a fabrication operation, in accordance with one or more embodiments. At the present fabrication operation ILD 172' may be formed upon BCM 176 to fill metallization contact trench 174 and a top contact metallization (TCM) 182 is formed upon top S/D region 144 within a top contact metallization trench 180.

The ILD 172' may be formed upon BCM 176 to fill metallization contact trench 174 by depositing a dielectric material by PVD, CVD, ALD, or the like. Exemplary ILD 172' material(s) may be but are not limited to: $SiO_2$, a thin liner of SiN followed by $SiO_2$, or the like. In some embodiments, ILD 172' may be the same or different material(s) relative to ILD 172. ILD 172' may be formed within crevasses, trenches, or the like, within semiconductor structure 100. For example, ILD 172' may be formed upon BCM 176 within metallization contact trench 174, formed around the remaining exposed S/D region stack, etc.

After ILD 172' may be formed upon BCM 176 within metallization contact trench 174, metallization contact trench 180 may be formed within ILD 172 and/or ILD 172' to expose at least a portion of the top S/D region 144. For example, undesired portions ILD 172 and/or ILD 172' may be removed, to form metallization contact trench 180, by known patterning, lithography, and etching techniques. The metallization contact trench 180 may expose at least a portion of a top surface of top S/D region 144. The metallization contact trench 180 may further expose at least a portion of respective sidewalls or side surfaces of facing spacers 132 of neighboring replacement gate structures.

TCM 182 may be formed within metallization contact trench 180 upon at least a portion of the top S/D region 144 and upon the respective sidewalls or side surfaces of facing spacers 132 of neighboring replacement gate structures. TCM 182 may be formed by depositing a silicide liner, followed by depositing a adhesion layer, and depositing conductive metal.

Subsequently, the top surface of semiconductor structure 100 may be planarized by, e.g., a CMP, or the like. For example, the respective top surfaces of ILD(s) 172, 172'; spacers 132' replacement gate structures (e.g., top surface of gate cap 162), TCM 182, etc. may be coplanar.

As depicted, semiconductor structure 100 may be formed to include a CFET that may include bottom S/D regions 140 separated from top S/D regions 144 by S/D isolator 142. The CFET may further include a common replacement gate structure that may be physically connected to channel regions 109 of one or more fins 120 and may be physically connected to channel regions 105 of the one or more fins 120. The channel region(s) 109 and channel region(s) 105 may also be physically connected to the S/D regions 140 and to top S/D regions 144. A portion of the isolator 106 between the channel region(s) 109 and the channel region(s) 105 may be referred to as a channel isolator. The common replacement gate structure may be electrically connected to a BEOL gate contact, as is known in the art. Each top S/D region 144 may further be connected to a TCM 182 and each bottom S/D region 140 may further be connected to a BCM 176. The TCM 182 may be electrically connected to a BEOL gate contact, as is known in the art. The CFET may further include spacer foot 132' upon the bottom portion of bottom S/D region 140. The spacer foot 132' may physically and at least partially electrical separate the BCM 176 from the remaining fins 120 and/or substrate 104 generally located under the bottom S/D region 140.

Figure 16:
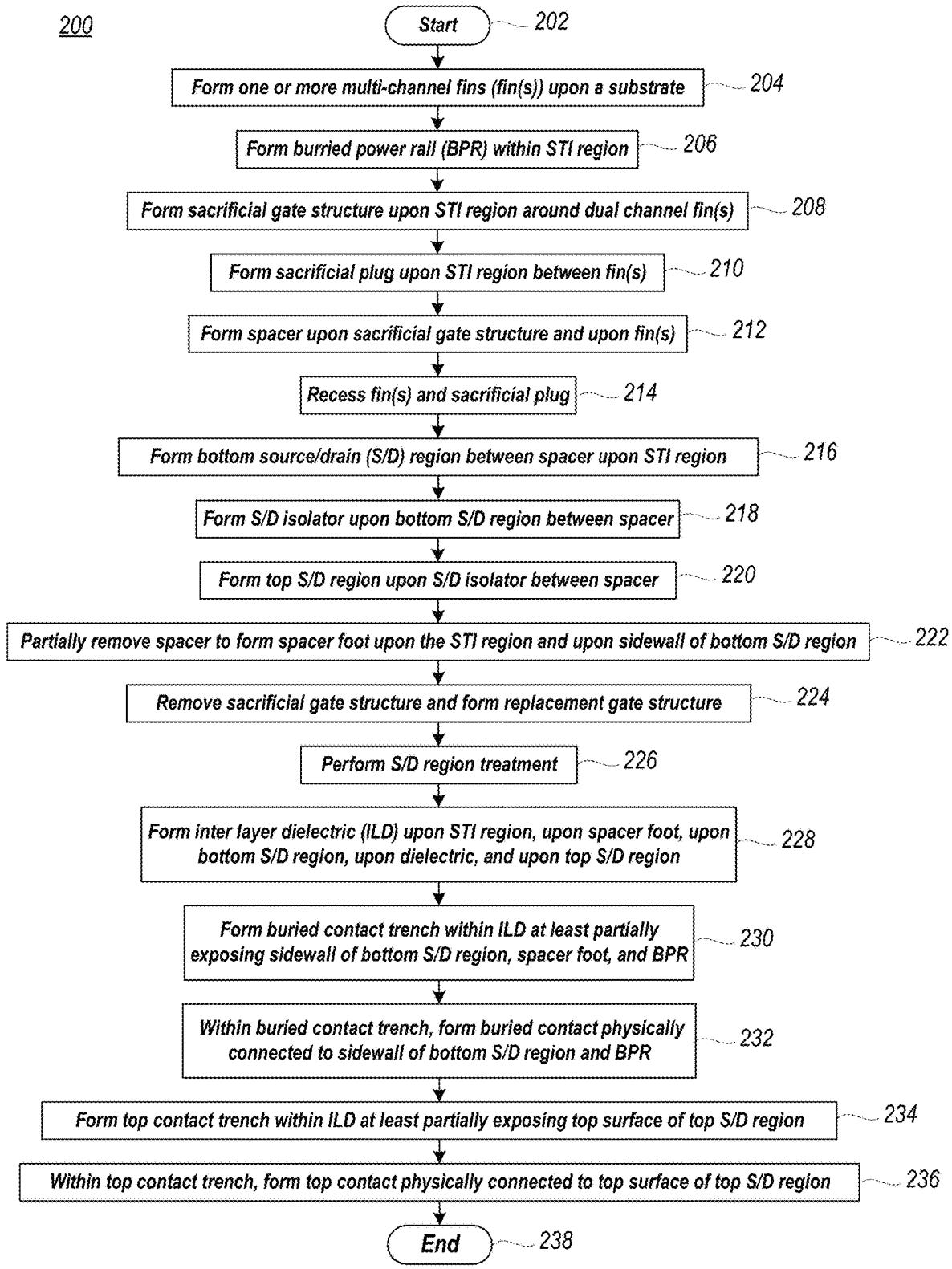
FIG. 16 is a flow diagram illustrating a semiconductor device fabrication method, in accordance with one or more embodiments.

FIG. 16 is a flow diagram illustrating a semiconductor device 100 fabrication method 200, in accordance with one or more embodiments. Method 200 begins at block 202 and may continue with forming one or more multi-channel fins 120 upon a substrate (block 204). For example, a first fin 120 and a second fin 120 (i.e., a fin pair) may be formed upon or within a substrate 102. The multi-channel fin may include a lower channel portion 105 separated from an upper channel portion 109 by an isolator 106, respectively.

Method 200 may continue with forming a buried power rail(s) 124 within STI region(s) (block 206). For example, STI region 122 material may be formed, the STI region 122 material may be planarized stopping upon the top surface of the fin 120 mask 112, a buried power rail trench may be formed within the STI region 122 material, the buried power rail 124 may be formed within the buried power rail trench, the buried power rail 124 may be planarized and/or recessed, further STI region 122 material may be formed, the additional STI region 122 material may be planarized stopping upon the top surface of the fin 120 mask 112, and STI region 122 material may be recessed, and the mask that may be upon the fin(s) may be removed, etc.

Method 200 may continue with forming a sacrificial gate structure upon the STI region(s), around the dual channel fin(s) (block 208). The sacrificial gate structures may be formed by depositing sacrificial gate 110 material layer upon STI region(s) 122 and upon and between fin(s) 120. Subsequently, gate mask 112 layer may be formed upon the sacrificial gate 110 material layer. Undesired portions of sacrificial gate 110 material layer and associated undesired portions of the gate mask 112 layer may be removed, while desired portions of sacrificial gate 110 material layer and associated desired portions of the gate mask 112 layer may be retained. These retained features may form the sacrificial gate structures, which may include the sacrificial gate 110 with gate mask 112 thereupon, respectively.

Method 200 may continue with forming sacrificial plug 130 between and/or adjacent to the fin(s) 120 upon the STI region 122 (block 210). The sacrificial plug 130 may pinch-off or otherwise fill the region between the fins 120. Method 200 may continue with forming spacer 132 upon the exposed sidewalls of fin(s) 120 and upon the sidewalls of the sacrificial gate structures (block 212). For example, spacer(s) 132 may be formed upon an outwardly facing sidewall of the first fin 120 and upon an outwardly facing sidewall of the second fin 120, if two fins 120 are formed. Similarly, spacer(s) 132 may be formed upon the respectively coplanar sidewalls of sacrificial gate 110 and gate cap 112. For example, spacer(s) 132 may be formed upon an outwardly facing sidewall of a first sacrificial plug 130 upon the fin 120 sidewall and upon an outwardly facing sidewall of a second sacrificial plug 130 upon the fin, if one fin 120 is formed.

Method 200 may continue with forming fin trench 134 by recessing fin(s) 120 and recessing the sacrificial plug(s) 130 between spacers 132 (block 214). The fin trench 134 may be a cavity or recess formed within the first fin 120 and second fin 120. Undesired portions of fins 120 and sacrificial plug 130 may be removed between facing spacers 132 of neighboring sacrificial gate structures in the X cross section and may be removed between spacers 132 in the Y cross section. The fin trench 134 may expose respective facing vertical sidewalls of spacers 132, may form a bottom well surface and respective facing vertical sidewalls of substrate 104, may form respective facing vertical sidewalls of insulator 106, and may form respective facing vertical sidewalls of substrate 108. Such respective vertical sidewalls may be coplanar with the outward sidewall of spacer 132 associated with sacrificial gate structures, there above.

Method 200 may continue with forming S/D region 140 between the spacer(s) 132 upon the STI region 122 (block 216). For example, in the X cross section, the bottom S/D region 140 may be formed upon the exposed fin trench 134 surfaces of the respective first fin 120 and second fin 120 substrate 104 and may be partially formed upon the exposed fin trench 134 surfaces of the respective first fin 120 and second fin 120 insulator 106. In the Y cross section, the bottom S/D region 140 may be formed upon the exposed fin trench 134 surfaces of the inner facing surfaces of spacer(s) 132, may be formed upon the partially recessed first fin 120 and the second fin 120, and upon the STI region 122 between the first fin 120 and the second fin 120.

Method 200 may continue with forming S/D isolator 142 upon the bottom S/D region 140 (block 218). S/D isolator 142 may be formed upon the bottom S/D region 140. The S/D isolator 142 may be formed upon the exposed fin trench 134 surfaces of insulator 106. In some embodiments, a S/D isolator 142 material layer may be formed within fin trench 134 upon the bottom S/D region 140 between spacers 132 and between insulator 106 and may be formed upon STI regions 122 and upon sidewall(s) of spacer 132.

Method 200 may continue with forming top S/D region 144 upon the S/D isolator between spacers 132 (block 220). For example, in the X cross section, the top S/D region 144 may be formed upon the exposed fin trench 134 surfaces of the respective first fin 120 and second fin 120 substrate 108 and may be partially formed upon the exposed fin trench 134 surfaces of the respective first fin 120 and second fin 120 insulator 106. In the Y cross section, the top S/D region 144 may be formed upon the exposed fin trench 134 surfaces of the inner facing surfaces of spacer(s) 132.

Method 200 may continue with partially removing spacer(s) 132 to form spacer foot 132' upon the STI region 122 and upon the lower or bottom sidewall of the bottom S/D region 140 (block 222). The spacer foot 132' may be formed by protecting the spacer 132 that is located around the sacrificial gate structure(s) while partially recessing the spacer(s) 132 that are located upon or associated with the sidewall(s) of the S/D region stack. The portion of the spacer 132 that is upon the STI region(s) 122 and upon the sidewall(s) of the S/D region stack (e.g., upon the sidewall of bottom S/D region 140) may be retained and forms spacer foot 132'.

Method 200 may continue with removing the sacrificial gate structure and form the replacement gate structure in place thereof (block 224). The sacrificial gate structure may be removed by known patterning, lithography, etching, etc. techniques and may form a replacement gate trench. The replacement gate trench may expose at least a portion of a sidewall or side surface of the fins 120. For example, the replacement gate trench may expose at least a portion of the sidewall or side surface of substrate 108, isolator 106, and substrate 104 of the fins 120.

A replacement gate structure may be formed by depositing a gate dielectric liner, by depositing work function metal(s) 160, and by depositing a gate cap 162 material within the replacement gate trench. The replacement gate structure may be formed around the first fin 120 and the second fin 120, such that the replacement gate structure is formed around or upon the exposed portions of the fins 120 sidewalls or side surfaces (e.g., formed upon substrate 108, isolator 106, and substrate 104). As such the replacement gate structure may serve as a common gate to two vertically stacked FETs. For example, the replacement gate structure may be the common gate to a top FET that includes top S/D regions 144 and the first fin 120 and second fin 120 channel regions 109 therebetween and a bottom FET that includes bottom S/D regions 140 and the first fin 120 and second fin 120 channel regions 105 therebetween.

Method 200 may continue with performing a S/D region 140 and/or S/D region 144 treatment (block 226). For example, a Si, Ge, Xe implantation may be applied to bottom S/D region 140, top S/D region 144, as appropriate, to amorphize the surface(s) thereof. The surface amorphization may reduce the electrical resistance between such respective regions and the S/D contact associated therewith.

Method 200 may continue with forming ILD 172 upon the STI region, upon the spacer foot 132', upon the lower S/D region 140, upon S/D isolator 142, and upon the S/D region 144 (block 228).

Method 200 may continue with forming metallization contact trench 174 may be formed within ILD 172 (block 230). The metallization contact trench 174 may expose at least a portion of a sidewall or side surface of the foot or bottom region of bottom S/D region 140 and expose at least a portion of buried power rail 124. The metallization contact trench 174 may further expose portion(s) of STI region 122 above the exposed buried power rail 124; may further expose portion(s) of spacer foot 132'; may further expose at least a portion of a sidewall or side surface of S/D isolator 142; may further expose at least a portion of a sidewall or side surface of top S/D region 144; may further expose at least a portion of a top surface of top S/D region 144; and may further expose at least a portion of respective sidewalls or side surfaces of facing spacers 132 of neighboring replacement gate structures.

Method 200 may continue with forming BCM 176 within the metallization contact trench 174 (block 232). BCM 176 may be formed within metallization contact trench 174 upon at least a portion of the buried power rail 124 and upon at least a portion of the side surface or sidewall of bottom S/D region 140. BCM 176 may be further be formed within metallization contact trench 174 around the spacer foot 132'. In some implementations, BCM 176 is formed self-aligned to the spacer foot 132'.

Method 200 may continue with forming metallization contact trench 180 within ILD 172 and/or ILD 172' to expose at least a portion of the top S/D region 144 (block 234). For example, undesired portions ILD 172 and/or ILD 172' may be removed, to form metallization contact trench 180, by known patterning, lithography, and etching techniques. The metallization contact trench 180 may expose at least a portion of a top surface of top S/D region 144. The metallization contact trench 180 may further expose at least a portion of respective sidewalls or side surfaces of facing spacers 132 of neighboring replacement gate structures.

Method 200 may continue with forming TCM 182 upon the top S/D region 144 (block 236). TCM 182 may be formed within metallization contact trench 180 upon at least a portion of the top S/D region 144 and upon the respective sidewalls or side surfaces of facing spacers 132 of neighboring replacement gate structures. Subsequently, the top surface of semiconductor structure 100 may be planarized by, e.g., a CMP, or the like. For example, the respective top surfaces of ILD(s) 172, 172'; spacers 132' replacement gate structures (e.g., top surface of gate cap 162), TCM 182, etc. may be coplanar. Method 200 may end at block 238.

The method flow diagrams depicted herein are exemplary. There can be many variations to the diagrams or operations described therein without departing from the spirit of the embodiments. For instance, the operations can be performed in a differing order, or operations can be added, deleted or modified. All of these variations are considered a part of applicable claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
   a fin comprising a bottom channel portion, a top channel portion, and a channel isolator between the bottom channel portion and the top channel portion;
   a source and drain stack comprising a bottom source or drain (S/D) region connected to the bottom channel portion, a top S/D region connected to the top channel portion, and a source-drain isolator directly connected with both and in between the bottom S/D region and the top S/D region;
   a spacer foot directly connected to a base sidewall portion of the bottom S/D region; and
   a buried S/D contact directly connected to an upper sidewall portion of the bottom S/D region that is above the spacer foot.

2. The semiconductor device of claim 1, wherein the buried contact is further directly connected to a buried power rail.

3. The semiconductor device of claim 2, further comprising:
   a top S/D contact directly connected to an upper surface of the top S/D region.

4. The semiconductor device of claim 1, wherein a top surface of the buried S/D contact is between a top surface of the source-drain isolator and a bottom surface of the source-drain isolator.

5. The semiconductor device of claim 1, a common gate around the bottom channel portion, around the top channel portion, and around the channel isolator.

6. The semiconductor device of claim 1, wherein the buried S/D contact is further directly connected to a top surface of the spacer foot and physically connected to a sidewall of the spacer foot.

7. The semiconductor device of claim 1, wherein an entire top surface of the bottom S/D region is covered by the source-drain isolator that is directly connected thereto.

8. A semiconductor device comprising:
   a fin pair comprising: a first fin comprising a first bottom channel portion, a first top channel portion, and a first channel isolator between the first bottom channel portion and the first top channel portion; and a second fin comprising a second bottom channel portion, a second top channel portion, and a second channel isolator between the second bottom channel portion and the second top channel portion;

a source and drain stack comprising a bottom source or drain (S/D) region connected to the first bottom channel portion and to the second bottom channel portion, a top S/D region connected to the first top channel portion and to the second top channel portion, a source-drain isolator directly connected with both and in between the bottom S/D region and the top S/D region;

a spacer foot directly connected to a base sidewall portion of the first bottom S/D region; and a buried S/D contact directly connected to an upper sidewall portion of the first bottom S/D region.

9. The semiconductor device of claim 8, wherein the buried contact is further directly connected to a buried power rail.

10. The semiconductor device of claim 9, further comprising:

a top S/D contact directly connected to an upper surface of the first top S/D region.

11. The semiconductor device of claim 8, wherein a top surface of the buried S/D contact is between a top surface of the source-drain isolator and a bottom surface of the source-drain isolator.

12. The semiconductor device of claim 8, further comprising: a common gate around the fin pair.

13. The semiconductor device of claim 8, wherein the buried S/D contact is further directly connected to a top surface of the spacer foot and directly connected to a sidewall of the spacer foot.

14. The semiconductor device of claim 8, wherein sidewalls of the source-drain isolator are coplanar and vertically aligned with respective sidewalls of the bottom S/D region and are coplanar and vertically aligned with respective sidewalls of the top S/D region.

* * * * *